United States Patent [19]

Terada et al.

[11] 4,232,071
[45] Nov. 4, 1980

[54] METHOD OF PRODUCING MAGNETIC THIN FILM

[75] Inventors: Akira Terada, Mito; Seizi Hattori, Tomobe; Yoshikazu Ishii; Akira Nohara, both of Mito; Nobuo Inagaki, Katsuta; Wakatake Matsuda, Zama; Susumu Kawakami, Tama, all of Japan

[73] Assignees: Nippon Telegraph and Telephone Public Corporation, Tokyo; Fujitsu Limited, Kawasaki, both of Japan

[21] Appl. No.: 811,294

[22] Filed: Jun. 29, 1977

[30] Foreign Application Priority Data

Jul. 1, 1976 [JP] Japan ................................. 51-78611

[51] Int. Cl.$^2$ ........................................... H01F 10/02
[52] U.S. Cl. .................. 428/64; 204/192 M; 427/130; 428/539; 428/900
[58] Field of Search ...................... 427/127–132, 427/48; 428/64, 539, 900; 204/192 M

[56] References Cited

U.S. PATENT DOCUMENTS

| | | | |
|---|---|---|---|
| 3,148,079 | 9/1964 | Banks | 427/130 |
| 3,374,113 | 3/1968 | Chang et al. | 427/130 X |
| 3,795,542 | 3/1974 | Halaby et al. | 427/38 |
| 3,996,395 | 12/1976 | Chen et al. | 427/130 |
| 4,015,030 | 3/1977 | Sasazawa et al. | 427/130 |

*Primary Examiner*—Bernard D. Pianalto
*Attorney, Agent, or Firm*—Burns, Doane, Swecker & Mathis

[57] ABSTRACT

A method of roducing $\gamma$-Fe$_2$O$_3$ magnetic disk medium of continuous thin film is provided, in which a deposition source is deposited on an opposed Al-alloy substrate by means of a reactive vacuum deposition technique and the deposited film is thermally treated so as to be the magnetic disk medium. As the deposition source, a ferroalloy containing about 1 to 10 at.% Ti and about 0.5 to 5 at.% Co is employed.

9 Claims, 6 Drawing Figures

METHOD OF PRODUCING MAGNETIC THIN FILM

This invention relates to methods of producing magnetic thin films and, more particularly, to a method of stably producing on an aluminium alloy substrate a continuous thin film of $\gamma$-$Fe_2O_3$ which is applicable to a recording medium such as file memories and specifically magnetic disks and is capable of achieving a high recording density with less stress-induced demagnetization because of excellent magnetic characteristics and further the recording medium produced according to the method.

The recording mediums of the kind referred to which have been employed as the magnetic disks have been mostly coating disks of $\gamma$-$Fe_2O_3$ fine particles. This $\gamma$-$Fe_2O_3$ fine particle coating disk has been produced in such manner that, in order to elevate adhesion property between the aluminum substrate and the recording medium and to obtain desired magnetic characteristics, the fine particles of $\gamma$-$Fe_2O_3$ are uniformly dispersed in an epoxy series binder, thereafter applied onto the aluminum substrate by means of a spin coating, dried and polished so as to be a magnetic disk body.

Figure 1:
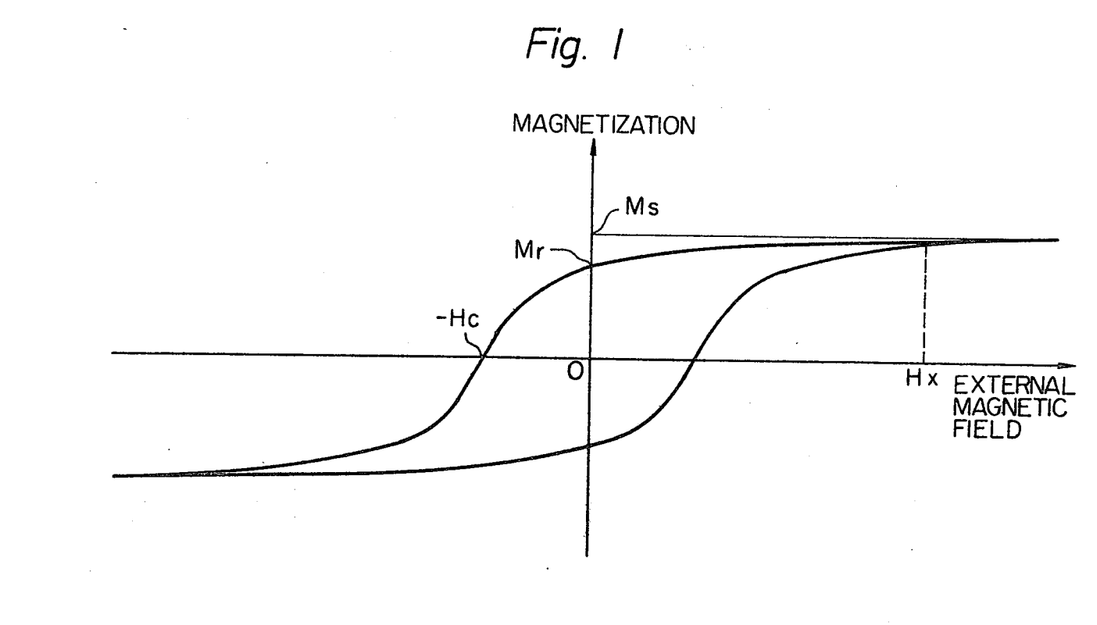

It is effective, as has been well known, to form the medium in a thin layer in order to elevate the recording density of the magnetic disk medium and to render residual magnetic flux density Br of the recording medium to be larger in order to achieve less reduction of readout amplitude in spite of that the layer is made thin. Further, it is also effective, in the recording medium of the thin layer and having high residual magnetic flux density (which shall be referred to simply "high Br" hereinafter), to elevate the rectangularness of hysteresis loop of the medium so as to render coersive force Hc larger. The rectangularness of hysteresis loop is, as shown in FIG. 1, represented by squareness ratio Mr/Ms, coersive squareness S*

$$1 - \frac{Mr}{Ms} \quad \frac{1}{\left(\frac{dM}{dH}\right) H = -Hc}$$

representing the degree of bulges of the loop in second and fourth quadrants and ratio Hx/Hc of magnetic field Hx where the loop closes with respect to the coersive force Hc.

As described above, the $\gamma$-$Fe_2O_3$ fine particle coating disk contains about 80 volume % of non-magnetic binder so that effective residual magnetic flux density Br will be low and output signals of the disk will be lowered indistinguishably in the case when the disk is made thin. In the event where the disk is made thin with an increased $\gamma$-$Fe_2O_3$ fine particle content and a higher Br, on the other hand, there will be caused pinholes inside the recording medium or fluctuations in its thickness and it is extremely difficult to produce at a high efficiency the coating disk of about $10^3$ A in respect of coating techniques. In the case of the $\gamma$-$Fe_2O_3$ fine particle coating disk, further, a certain level of the rectangularness of the hysteresis loop can be achieved but there is a problem in producing the fine particles with higher coersive force. For these reasons, the $\gamma$-$Fe_2O_3$ fine particle coating disks still remain to be of a relatively lower recording density.

Before reaching the present invention, the present inventors have conducted certain investigations of the method of producing the continuous $\gamma$-$Fe_2O_3$ thin film as a high Br thin medium which has a high rectangularness of hysteresis loop because of the compressive stress system between the film and the aluminum substrate. As is well known, the coercive force may be made larger if Co is added to the $\gamma$-$Fe_2O_3$ film, and a high recording density may thus be achieved. Primarily investigated as the method of producing the continuous $\gamma$-$Fe_2O_3$ thin film has been the one in which a continuous $\alpha$-$Fe_2O_3$ thin film was formed on an anodized aluminium alloy substrate by means of a reactive sputtering by a sufficient oxidation within an $Ar+O_2$ atmosphere and using a deposition source of an alloy substantially consisting of pure iron, the film was subsequently reduced so as to be $Fe_3O_4$ and the same was then subjected to an atmospheric oxidation so as to be the continuous $\gamma$-$Fe_2O_3$ thin film. Referring here to the oxidation of Fe, the same can be achieved in the following sequence:

$$Fe \rightarrow Fe_3O_4 \rightarrow \gamma\text{-}Fe_2O_3 \rightarrow \alpha\text{-}Fe_2O_3$$

The degree of oxidation increases as the sequence advances in the direction of the arrows. Here, the oxidation from Fe to $Fe_3O_4$ is called weak oxidation whereas the one to $\alpha$-$Fe_2O_3$ is called sufficient oxidation. The sufficient oxidation reactive sputtering is an oxidation of metallic target surface into the above referred sufficient oxidation state in forming the film by means of the reactive sputtering.

A second method has been investigated next, in which an $Fe_3O_4$ film was directly deposited from an alloy deposition source substantially consisting of Fe onto an anodized aluminium alloy substrate by means of the reactive sputtering by the weak oxidation performed within an $Ar+O_2$ atmosphere and thereafter the film was subjected to an atmospheric oxidation so that the continuous $\gamma$-$Fe_2O_3$ thin film medium could be produced.

In further investigated as a third method, the $Fe_3O_4$ film was directly deposited on an aluminium alloy substrate from a sintered deposition source of $\alpha$-$Fe_2O_3$ by means of a reducing reactive sputtering performed within an $Ar+H_2$ atmosphere, thereafter the film was subjected to an atmospheric oxidation and the continuous $\gamma$-$Fe_2O_3$ thin film medium was produced.

The respective $\gamma$-$Fe_2O_3$ thin film mediums produced according to the above described three methods were of high Br so as to be about four times as large as that of the before described coating disk and the thin film formation for the recording medium was easy, whereby it was enabled to achieve the high recording density.

While the above three methods investigated have all been the ones in which the reactive sputtering was employed, the present inventors have also made investigations of other producing methods employing reactive evaporation.

It has been found, however, that the respective methods described hereinabove have involved such a problem that the coersive force Hc is caused to largely fluctuate depending on oxidizing conditions at the time when $Fe_3O_4$ is subjected to the atmospheric oxidization so as to be the $\gamma$-$Fe_2O_3$ medium and thereby desired control of the coersive force Hc is made uneasy. Further, in the case of the continuous $\gamma$-$Fe_2O_3$ thin film, recording material is directly exposed above the aluminium alloy substrate as being different from the coating disks in which $\gamma$-$Fe_2O_3$ fine particles are covered with binder, so that there will be recognized an occurrence of the phenomenon known as stress-induced demagnetization according to which the read out amplitude is lowered due to a landing of magnetic head, wiping action by means of gauze or the like with respect to the recording medium, and so on. The present invention has been suggested to successfully solve such problem as above by adding simultaneously titanium and cobalt to the deposition source employed in producing the continuous $\gamma$-$Fe_2O_3$ thin film magnetic disk medium by means of such reactive vacuum deposition as reactive sputtering, reactive evaporation or the like and subsequent thermal treatment.

Primary object of the present invention is, therefore, to provide a method of producing magnetic thin film which has a high rectangularness in the hysteresis loop so as to enable it to achieve a high recording density.

Another object of the present invention is to provide a method of producing magnetic thin film which causes less stress-induced demagnetization.

A further object of the present invention is to provide a method of producing magnetic thin film of which coersive force controlling is easy.

Yet another object of the present invention is to provide a magnetic recording medium which is capable of achieving a high recording density and is of less stress-induced demagnetization.

Other objects and advantages of the present invention shall be made clear as the following descriptions of the invention advance with reference to accompanying drawings, in which:

FIG. 1 is a diagram for explaining hysteresis loop properties of general recording mediums of the kind referred to;

While the present invention shall now be explained with reference to certain preferred examples, it should be understood that the intention is not to limit the invention to the particular examples but is to rather include all modifications, alterations and equivalent measures possible within the scope of appended claims.

Examples of the method according to the present invention shall be explained next. Sputtering apparatus employed in the following examples is the one available in the market with a deposition source of 150 mm$\phi$ in the meter. Evaporating apparatus employed in the following examples is also the one available in the market. For the substrate, an aluminium alloy plate of 360 mm$\phi$ and 1.9 mm thick which is generally used as the magnetic disk and the surface of which is anodized to the thickness of about 2 microns has been used, and this substrate was rotated at a rate of 4 rpm so that the medium could be made uniform in its thickness in all peripheral directions.

EXAMPLE 1

Four different deposition sources respectively consisting of pure iron, 3 at.% Co-Fe alloy, 3 at.% Co-5 at % Al-Fe alloy and 3 at.% Co-5 at.% Ti-Fe alloy were reactively sputtered in a mixture gas of Ar and $O_2$ with partial pressure ratio of 1:1 and under a total pressure of $2 \times 10^{-2}$ Torr, a thin film of $\alpha$-$Fe_2O_3$ was obtained on the substrate so as to be 0.15 $\mu$m thick by means of a reactive sputtering by sufficient oxidation, and a hydrogen reduction was performed with respect to the film at 300° C. for 3 hours, whereby the film was made to be of $Fe_3O_4$.

Figure 2:
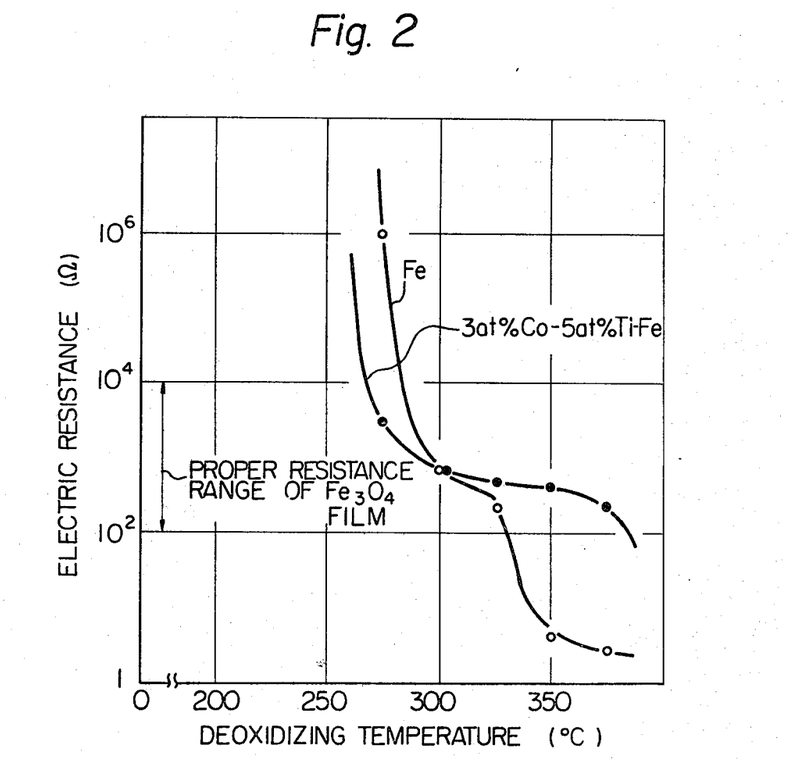
FIG. 2 is a diagram showing variations in the electrical resistance of a magnetic thin film produced by the present invention depending on the degree of reduction in steam containing hydrogen atmosphere.

The $\alpha$-$Fe_2O_3$ thin film to which Ti is added is featured in that its reducing temperature range is enlarged. In FIG. 2, measurements according to four terminal method of electric resistances of the film pointed with a mixture atmosphere of $H_2$ gas containing bubbling steam and dry $H_2$ gas at a volume ratio of 2:3 and at reducing temperatures varied from 200° C. to 375° C. are shown.

A proper range of electric resistance values of the $Fe_3O_4$ film is $10^2$–$10^4$ ohm, so that the deoxidation will be insufficient when the value is above $10^4$ and non-reacted $\alpha$-$Fe_2O_3$ will remain whereas the deoxidation will be excessive when the value is below $10^2$ and iron metal initiates to be precipitated. For this reason, the most important for producing the $Fe_3O_4$ film with the reduction of the $\alpha$-$Fe_2O_3$ is that the $Fe_3O_4$ film having a proper electric resistance should be obtained. As will be clear from FIG. 2, the deoxidizing temperature range of the $\alpha$-$Fe_2O_3$ film to which Ti is not added is so narrow as to be below 25° C. but the range is expanded to be more than 50° C. by the addition of Ti. It has been found, on the other hand, that actually measured values of electric resistance of 3 at.% Co-Fe film are substantially identical with those of the $\alpha$-$Fe_2O_3$ without the addition of Co and accordingly the addition of Co does not influence the deoxidizing temperature range at all.

Thus obtained magnetic thin films were respectively cut by a cutter so as not to induce any stress and magnetic characteristics of the respective films were measured by means of a vibrating sample magnetometer (which shall be referred to VSM hereinafter), results of which being shown in the following Table 1:

TABLE 1

| Deposition Source Composition | Magnetic Characteristics | | | | |
|---|---|---|---|---|---|
| | Br (G) | Hc (Oe) | Rectangularness | | |
| | | | Mr/Ms | S* | Hx/Hc |
| Fe | 3000 | 195 | 0.56 | 0.52 | 4.3 |
| 3 at.%C0-Fe | 2900 | 550 | 0.54 | 0.50 | 5.1 |
| 3 at.%C0-5 at.%Al-Fe | 3000 | 570 | 0.68 | 0.59 | 3.4 |
| 3 at.%Co-5 at.%Ti-Fe | 2800 | 520 | 0.72 | 0.62 | 2.8 |
| $\gamma$-$Fe_2O_3$ fine particle coating disk | 700 | 330 | 0.75 | 0.60 | 2.5 |

Comparing in the above table the characteristics of the deposition source composition of 3 at.% Co-5 at.% Ti-Fe with those of the conventional $\gamma$-$Fe_{-2}O_3$ fine particle coating disk, it is seen that the residual magnetic flux density Br of the former is remarkably larger than that of the latter, whereas the both show substantially the same rectangularness of the hysteresis loop.

EXAMPLE 2

The $Fe_3O_4$ films obtained in the same manner as in Example 1 were respectively oxidized in the atmosphere for one hour and investigations of conditions for producing the γ-Fe₂O₃ thin film medium were conducted. Oxidizing temperature level was set to be from about 200° C. to about 400° C., and date were taken at every moment of about 20° C.

Figure 3:
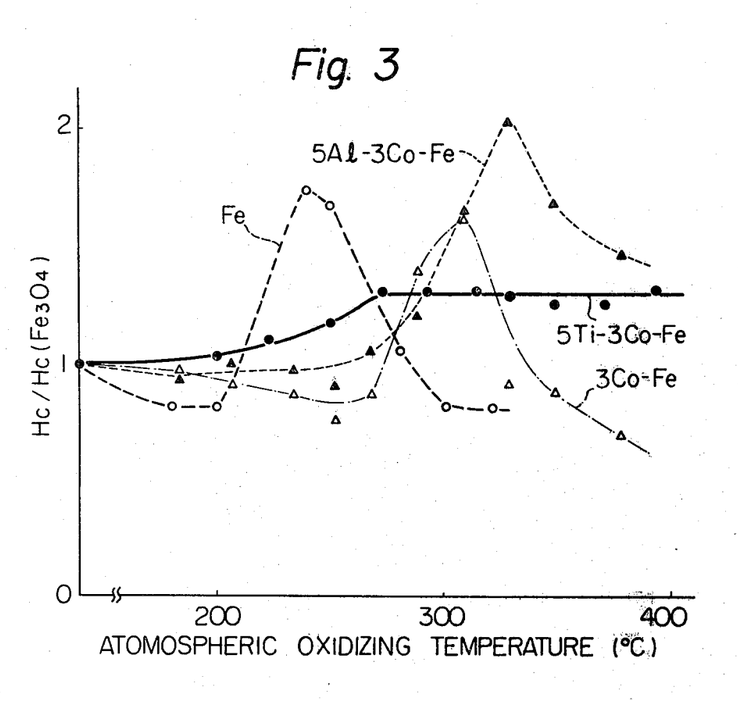
FIG. 3 is a diagram showing relation curves of atmospheric oxidizing temperature to coersive force Hc/Hc($Fe_3O_4$)

Referring to FIG. 3 showing the relation between the oxidizing temperature and the coersive force in the respective films, wherein the coersive force of each film being normalized by its value of Fe₃O₄, it is seen that the coersive force Hc/Hc(Fe₃O₄) shows the maximum value in the oxidizing temperature range of 250°–350° C. in the cases where the deposition sources of Fe, 3 at.% Co-Fe and 3 at.% Co-5 at.% Al-Fe are used. For this reason, a highly precise temperature control becomes necessary for controlling the coersive force of the γ-Fe₂O₃ thin film medium and the use of such deposition sources is not advantageous to any mass production. On the other hand, in the case where the deposition source of 3 at.% Co-5 at.% Ti-Fe is used, the coersive force of the film becomes flat with respect to the oxidizing temperatures above 250° C. Therefore, the γ-Fe₂O₃ medium with the addition of Ti and Co has such features that the same allows to obtain desired medium of a constant coersive force with an excellent reproducibility. Further, there can be seen such a tendency that, if oxidizing time is made longer, the temperature at which the film is sufficiently varied to be of γ-Fe₂O₃ becomes lower and, thus, the Fe₃O₄ film with the addition of Ti-Co described before can be provided with a constant coersive force through a treatment of, for example, 250° C. and 2 hours, so that an inexpensive aluminium alloy substrate will be enabled to be advantageously employed.

Magnetic characteristics of the above four different γ-Fe₂O₃ thin film mediums are as shown in the following Table 2, in which the rectangularness of the hysteresis loop is seen as being improved by the variation into γ-Fe₂O₃ with respect to any one of the different compositions. In particular, the film with the addition of Ti-Co is most excellent in view of its rectangularness and is superior than the conventional γ-Fe₂O₃ fine particle coating disk.

It appears that the reason for the improvement in the magnetic characteristics of the γ-Fe₂O₃ film with Ti added, specifically in that its hysteresis loop is more squared, is well related to crystal grain size. It is already known that the magnitude of the coersive force relates to the crystal grain size when the same is in a range of 100 Å to 300 Å and the coersive force shows a large extent variation in response to the crystal grain size which grows as thermal-treating temperature rises. However, investigations of respective aspects of grain growth in the γ-Fe₂O₃ film with Ti added by means of electron-microscopic observations have revealed that the grain growth starts suddenly at 250° C. but is constant at temperatures above 275° C. so as to be of the crystal grain size of 500 Å, irrespective of the rise of the temperature and, hence, it is considered that the stabilization of the magnetic characteristics with respect to the temperature has been enabled to obtain in the particular film with Ti added because of such remarkably unique grain growth.

TABLE 2

| Deposition Source Composition | Magnetic Characteristics | | | | |
|---|---|---|---|---|---|
| | Br (G) | Hc (Oe) | Rectangularness | | |
| | | | Mr/Ms | S* | Hx/Hc |
| Fe | 2900–3000 | 200–120 | 0.7–0.75 | 0.6–0.7 | 2.0–2.5 |
| 3 at.%Co-Fe | 2700–3200 | 600–350 | 0.7–0.8 | 0.6–0.7 | 2.0–3.0 |
| 3 at.%Co-5 at.%Al-Fe | 2700–3000 | 900–700 | 0.7–0.85 | 0.6–0.75 | 1.8–2.5 |
| 3 at.%Co-5 at.%Ti-Fe | 2500–2900 | 790–820 | 0.7–0.85 | 0.7–0.8 | 1.6–2.2 |

EXAMPLE 3

Figure 4:
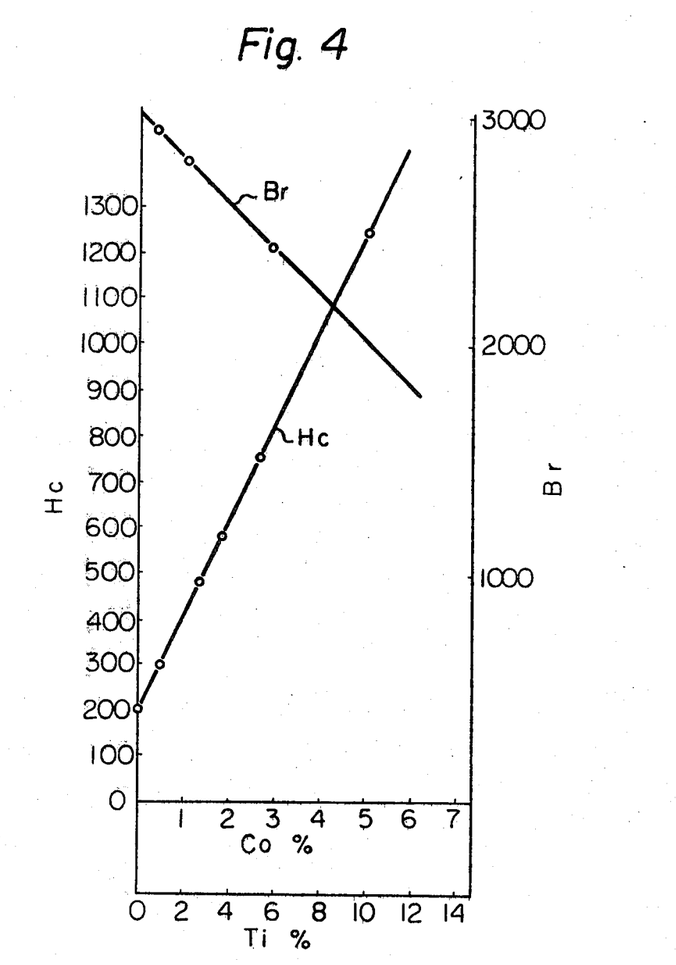
FIG. 4 is a diagram showing relations of respective added titanium and cobalt amounts to coersive force Hc and residual magnetic flux density Br.

An alloy deposition source was made by simultaneously adding Co at every 0.5 at.% in a range of 0–5 at.% and Ti at every 2 at.% in a range of 1–13 at.%, an Fe₃O₄ film of 0.15 μm was formed on the substrate in the same manner as in Example 1, the film was subjected to an atmospheric oxidizing treatment at temperatures of 250° C. and 300° C. for two hours and a γ-Fe₂O₃ thin film medium with Ti-Co added was produced. Characteristics of resultant product are shown in FIG. 4 wherein added amounts of Ti and Co are shown with at.% in the alloy deposition source. According to these characteristics, the coersive force of the medium was increased irrespective of added amount of Ti but rather in proportion to Co amount so that about 300 Oe coersive force could be obtained with the addition of 0.5 at.% Co and about 1250 Oe with the addition of 5 at.% Co. It is necessary as has been described that the coersive force is large for achieving the high recording density but, if the coersive force is excessively large, magnetic head for recording and reproduction is rather saturated and the recording density is contrarily caused to be lowered. For this reason, the coersive force of the medium should have an upper limit, which is about 1250 Oe for general Ni-Zn or Mn-Zn ferrite head. In the case of the film with Ti added more than 1 at.%, further, there is a difference of only less than 6% in the coersive force between the film of an oxidation at 250° C. and the film of an oxidation at 300° C., and the coersive force shows substantially flat characteristics with respect to variations of the oxidizing temperature, similarly to the case of Example 2. Accordingly it is seen that the addition of Ti more than 1 at.% is effective in lowering the dependency of the coersive force on the oxidizing temperature. With the addition of Ti more than 1 at.%, the rectangularness of hysteresis loop of the γ-Fe₂O₃ thin film medium with Ti-Co added almost does not vary and is substantially equal to the value in the case of Example 2, but the residual magnetic flux density reduces substantially in proportion to the Ti addition amount so that it will change from 3000 G of the case without Ti addition to a value less than 2000 G in the case of Ti addition more than 10 at.%, whereby the advantage of continuous magnetic thin film is lost. In view of these results, it is determined that the most preferable is a simultaneous addition of 0.5 to 5 at.% Co and 1 to 10 at.% Ti, in order to obtain the recording medium having desired coersive force and residual magnetic flux density.

EXAMPLE 4

A sintered deposition source of α-Fe₂O₃ to which 2 at.% Ti and 2 at.% Co in metallic element ratio were simultaneously added was reactively sputtered in an atmosphere of mixture gas of Ar+H$_2$ at partial pressure ratio 1:1 and under a total pressure of $1.5 \times 10^{-2}$ Torr, an Fe$_3$O$_4$ film of 0.15 μm thick was directly formed on the substrate by means of a deoxidizing reactive sputtering, and a γ-Fe$_2$O$_3$ magnetic thin film medium was obtained through an atmospheric oxidizing treatment at 300° C. for three hours. Magnetic characteristics measured by VSM were Br=2900 G, Hc=560 Oe, Mr/Ms=0.81, S=0.82 and Hx/Hc=1.8.

EXAMPLE 5

An alloy deposition source of 1 at.% Ti−1.5 at.% Co-Fe was used in a mixture gas of 20% partial pressure of O$_2$ and Ar under total pressure of $2 \times 10^{-2}$ Torr and Fe$_3$O$_4$ film of 0.15 μm thick was directly formed on the substrate by means of a reactive sputtering by weak oxidation. Here, substrate temperature was 200° C. The formed film was oxidized in the air at 260° C. for three hours and a γ-Fe$_2$O$_3$ magnetic thin film medium was obtained. Magnetic characteristics measured by VSM were Br=3000 G, Hc=490 Oe, Mr/Ms=0.79, S*=0.78 and Hx/Hc=1.7.

As is clear from the above Examples 4 and 5, it is possible to produce the magnetic thin film medium having high rectangularness of the hysteresis loop even when employed method of the reactive sputtering is altered.

Next, certain examples employing some reactive evaporations as the reactive vacuum deposition of the film shall be referred to.

EXAMPLE 6

An ordinary evaporation apparatus generally available in the market was used and deposition source was prepared with a mixture of powder metals of pure iron, titanium and cobalt respectively of predetermined amount for achieving the composition ratio of 3 at.% Co−5 at.% Ti-Fe. After air was preliminarily discharged out of the chamber up to such a sufficiently high vacuum as of more than $10^{-5}$ Torr, O$_2$ gas was led into the vacuum through a leak valve while discharging air, and gas pressure was controlled to be $3 \times 10^{-4}$ Torr. Thereafter, evaporating heater was heated, an α-Fe$_2$O$_3$ film of 0.15 μm was formed at deposition rate of 20 Å/sec (1200 Å/min), then hydrogen deoxidation was performed at 300° C. for three hours and an Fe$_3$O$_4$ thin film was obtained. VSM measurements of the magnetic characteristics for this film were Br=2800 G, Hc=530 Oe, Mr/Ms=0.72, S*=0.62 and Hx/Hc=2.8, which were substantially identical to those in the case of such Fe$_3$O$_4$ film in the same composition of 3 at.% Co−5 at.% Ti-Fe produced by the sufficient oxidation reactive sputtering as described in Example 1.

EXAMPLE 7

The Fe$_3$O$_4$ film produced in the above Example 6 was thermally treated in the atmosphere at 300° C. for two hours and a γ-Fe$_2$O$_3$ magnetic thin film was obtained. VSM measurements of the magnetic characteristics for this thin film were Br=2900 G, Hc=800 Oe, Mr/Ms=0.80, S*=0.7 and Hx/Hc=2.0, which were substantially identical to those of the γ-Fe$_2$O$_3$ of the same composition that has been referred to in Example 2.

EXAMPLE 8

A deposition source of a mixture of powder metals of pure iron, titanium and cobalt respectively of predetermined amount for the composition of 3 at.% Co-5 at.% Ti-Fe was used, the evaporating heater was heated under an O$_2$ gas pressure of $3 \times 10^{-4}$ Torr to perform a reactive evaporation at a deposition rate of 60 Å/sec (3600 Å/min) and an Fe$_3$O$_4$ film of 0.15 μm thick was formed on the substrate. VSM measurements of magnetic characteristics for thus obtained Fe$_3$O$_4$ film were Br=2900 G, Hc=520 Oe, Mr/Ms=0.72, S*=0.62 and Hx/Hc=2.8.

Subsequently an atmospheric thermal treatment was performed with respect to the above film at 300° C. for two hours, and a γ-Fe$_2$O$_3$ thin film was obtained. VSM measurements of magnetic characteristics for this film were Br=3000 G, Hc=810 Oe, Mr/Ms=0.80, S*=0.75 and Hx/Hc=1.9.

As will be clear from the foregoing Examples 1, 4, 6, 7 and 8, the magnetic characteristics of the films obtained employing the reactive evaporation were identical to those of the films obtained with the reactive sputtering, as long as the compositions contained in the Fe$_3$O$_4$ film and γ-Fe$_2$O$_3$ film were identical to one another.

EXAMPLE 9

The recording density was measured for the γ-Fe$_2$O$_3$ thin film mediums with Ti-Co added to Examples 2, 4 and 5 and also for the γ-Fe$_2$O$_3$ fine particle coating medium. A magnetic head of core width 530 μm and gap length 0.67 μm was used at a peripheral velocity of 7 m/sec and as floated by 0.25 μm. The measured densities of these mediums were 940 BPM, 1010 BPM and 960 BPM, respectively, in the order of Examples 2, 4 and 5, whereas that of the conventional coating medium was 420 BPM.

EXAMPLE 10

The respective mediums obtained in the foregoing Examples 1 through 5 and also the coating medium were rotated respectively at a rate of 3000 rpm, recordings were made to these mediums by a magnetic head and, after reproduction outputs were read out, a vertical stress of 200 g/cm$^2$ was given to recorded tracks with a gauze surface, after which stress-induced magnetization loss was measured for every medium. Results of such measurements are shown in the following Table 3, in which the stress-induced magnetization loss is shown as a ratio ΔE/Eo in % of output reduction ΔE with respect to reproduction output Eo before the application of the stress.

TABLE 3

| Medium | ΔE/Eo (%) |
| --- | --- |
| Fe$_3$O$_4$ | 41 |
| 3 Co added Fe$_3$O$_4$ | 53 |
| 3 Co-5 Al added Fe$_3$O$_4$ | 48 |
| 3 Co-5 Ti added Fe$_3$O$_4$ | 10.1 |
| γ-Fe$_2$O$_3$ | 20.5 |
| 3 Co added γ-Fe$_2$O$_3$ | 35.8 |
| 3 Co-5 Al added γ-Fe$_2$O$_3$ | 12.3 |
| 3 Co-5 Ti added γ-Fe$_2$O$_3$ | 6.7 |
| 2 Co-2 Ti added γ-Fe$_2$O$_3$ | 5.4 |
| 1.5 Co-1 Ti added γ-Fe$_2$O$_3$ | 6.1 |
| γ-Fe$_2$O$_3$ fine particle coating medium | 5.3 |

In view of the above Table 3, it is seen that the stress-induced magnetization loss of the continuous magnetic thin film medium of $\gamma$-$Fe_2O_3$ with Ti-Co added is of the same level as the conventional coating medium and is superior than those of $Fe_3O_4$ and $\gamma$-$Fe_2O_3$ with other elements added.

According to the present invention, as has been described, it is enabled to stably obtain the recording medium having a larger coersive force and high residual magnetic flux density and excellent in the hysteresis loop rectangularness so that a high recording density and a less demagnetization of the medium can be achieved, by the feature that titanium and cobalt are simultaneously added to the reactive deposition source in producing the continuous $\gamma$-$Fe_2O_3$ thin film magnetic disk medium through the reactive vacuum deposition and subsequent thermal treatment. Therefore, in performing a mass-production of the magnetic disk mediums by directly forming on the substrate the $Fe_3O_4$ film by means of, for example, a sequential reactive sputtering device and oxidizing the film in the atmosphere, a deposition source of pure iron with titanium and cobalt added simultaneously is used, whereby the oxidizing temperature is lowered and the working temperature range is expanded so that the use of inexpensive aluminium alloy substrate can be made possible and further a batch treatment with a large scale atmospheric treatment furnace can be made performable. It is thus made possible to lower required cost for producing the magnetic disk medium.

Figure 5:
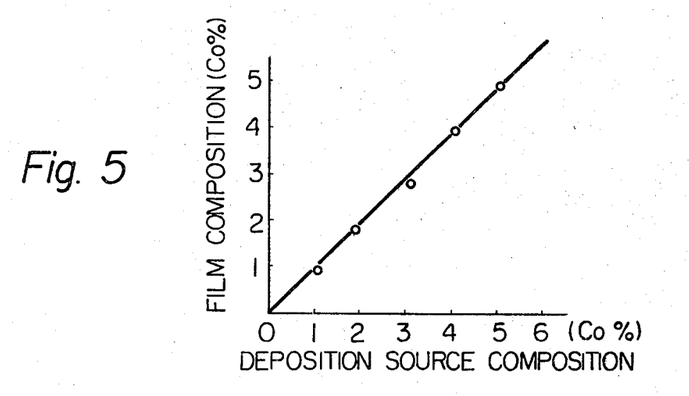
FIGS. 5 and 6 are diagrams showing relations between deposition source composition and film composition with respect to cobalt and titanium, respectively.
Figure 6:
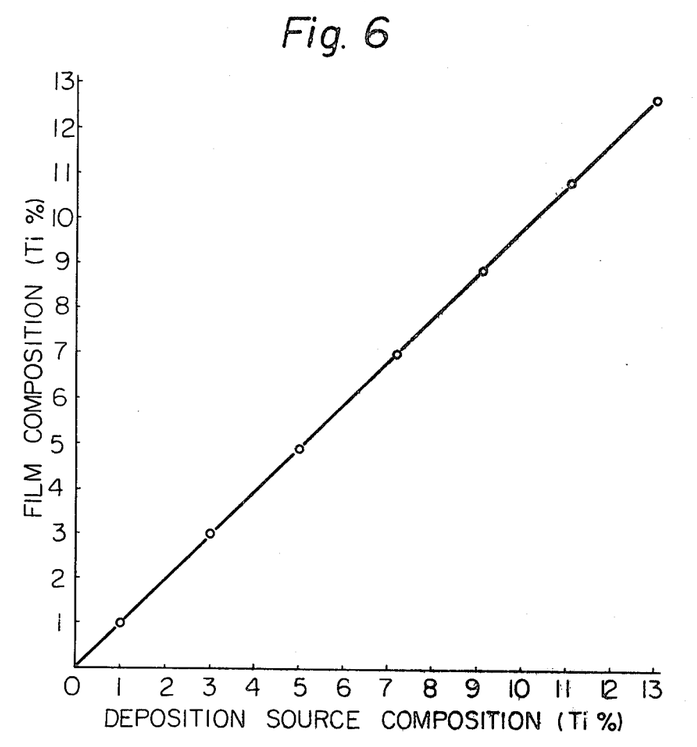

For the compositions referred to in the foregoing descriptions, they have been represented by means of compositions in the deposition source but, in FIGS. 5 and 6, relations obtained by a chemical analysis between the composition of deposition source and that of resultant magnetic thin film for the respective deposition sources employed in the foregoing Examples and diagramatically shown with reference to cobalt and titanium, respectively. Here, the magnetic film composition is represented such that the total of the metallic elements will be 100 at.% so as to render a comparison with the deposition source easier. Thus, in order to convert it to the added amount in $\gamma$-$Fe_2O_3$, it is necessary to multiply it by 0.4. By references thereto, it can be recognized that the deposition source composition and magnetic film composition are well in conformity to each other and that the deposition source composition as it stands is the magnetic film composition.

It should be also appreciated that the method according to the present invention, specifically the use of the deposition source of Ti-Co-Fe alloy, can be effectively applied to the production of continuous $\gamma$-$Fe_2O_3$ thin film magnetic medium with a formation of the $Fe_3O_4$ film through such a similar technique as a chemical deposition method or the like and subsequent atmospheric oxidation of the formed film.

What is claimed is:

1. In a method of producing a $\gamma$-$Fe_2O_3$ continuous thin film magnetic disk medium wherein a deposition source is deposited on an opposed aluminum alloy substrate by means of a reactive vacuum deposition and the film thus formed thermally treated to form the $\gamma$-$Fe_2O_3$ magnetic disk medium, the improvement comprising employing as the deposition source a ferroalloy comprising from about 1 to about 10 at.% titanium, from about 0.5 to about 5 at.% cobalt, and from about 85 to about 98.5 at.% iron.

2. A method according to claim 10 wherein said depositing step comprises a step of performing a reactive sputtering employing said source as a negative electrode and said substrate as a positive electrode.

3. A method according to claim 2 wherein said reactive sputtering performing step comprises steps of primarily defining an $Ar+O_2$ gas atmosphere between and around said source and said substrate, forming a thin film of $\alpha$-$Fe_2O_3$ on the substrate with a sufficient reactive oxidation, and performing a hydrogen deoxidation with respect to said film to reduce the $\alpha$-$Fe_2O_3$ to $Fe_3O_4$, said $Fe_3O_4$ being further oxidized to $\gamma$-$Fe_2O_3$ in said thermal treatment performing step.

4. A method according to claim 2 wherein said reactive sputtering performing step comprises steps of primarily defining an $Ar+O_2$ gas atmosphere between and around said source and said substrate, forming a thin film of $Fe_3O_4$ on the substrate with a weak reactive oxidation, and performing an atmospheric oxidation with respect to said film to oxidize said $Fe_3O_4$ to $\gamma$-$Fe_2O_3$.

5. A method according to claim 2 wherein said Fe in said source is in the form of $\alpha$-$Fe_2O_3$, and said reactive sputtering performing step comprises steps of primarily defining an $Ar+H_2$ gas atmosphere between and around said source and said substrate, forming a thin film of $Fe_3O_4$ on the substrate with a reactive deoxidation, and performing an atmospheric thermal treatment with respect to said film to oxidize said $Fe_3O_4$ to $\gamma$-$Fe_2O_3$.

6. A method according to claim 10 wherein said depositing step comprises a step of performing a reactive evaporation in which said source is heated.

7. A method according to claim 6 wherein said evaporation performing step comprises the steps of primarily defining an $O_2$ gas atmosphere between and around said source and said substrate, forming a thin film of $\alpha$-$Fe_2O_3$ on the substrate with a sufficient reactive oxidation, and performing hydrogen deoxidation with respect to said film to reduce the $\alpha$-$Fe_2O_3$ to $Fe_3O_4$, and said thermal treatment is performed in the atmosphere to oxidize said $Fe_3O_4$ to $\gamma$-$Fe_2O_3$.

8. A method according to claim 6 wherein said evaporation performing step comprises the steps of primarily defining an $O_2$ gas atmosphere between and around said source and said substrate, and forming a thin film of $Fe_3O_4$ on the substrate with a weak reactive oxidation, and said thermal treatment is performed in the atmosphere to oxidize said $Fe_3O_4$ to $\gamma$-$Fe_2O_3$.

9. In a magnetic disk medium comprising a continuous $Fe_2O_3$ thin film on an aluminum alloy substrate the improvement, wherein said film comprises from about 1 to about 10 at.% titanium, from about 0.5 to about 5 at.% Co and from about 85 to about 98.5 at.% iron.

* * * * *

UNITED STATES PATENT AND TRADEMARK OFFICE
CERTIFICATE OF CORRECTION

PATENT NO. : 4,232,071

DATED : November 4, 1980

INVENTOR(S) : Akira Terada et al

It is certified that error appears in the above—identified patent and that said Letters Patent is hereby corrected as shown below:

Claim 2, line 1, change "claim 10" to read -- claim 1 --.

Claim 6, line 1, change "claim 10" to read -- claim 1 --.

Signed and Sealed this

Fourteenth Day of July 1981

[SEAL]

Attest:

GERALD J. MOSSINGHOFF

Attesting Officer

Commissioner of Patents and Trademarks